(12) United States Patent
Jou

(10) Patent No.: US 6,549,077 B1
(45) Date of Patent: Apr. 15, 2003

(54) INTEGRATED INDUCTOR FOR RF TRANSISTOR

(75) Inventor: Chewnpu Jou, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/082,042

(22) Filed: Feb. 20, 2002

(51) Int. Cl.[7] ............................................. H03F 3/14
(52) U.S. Cl. ........................ 330/307; 330/302; 257/528
(58) Field of Search .................... 330/307, 302, 330/305, 306; 257/528, 531; 336/185, 208, 220

(56) References Cited

U.S. PATENT DOCUMENTS

| | | | |
|---|---|---|---|
| 4,297,647 A | * 10/1981 | Akiyama et al. | 330/307 |
| 5,656,849 A | 8/1997 | Burghartz et al. | 257/528 |
| 5,874,859 A | * 2/1999 | Amachi et al. | 330/307 |
| 5,914,508 A | * 6/1999 | Varmazis et al. | 330/307 |
| 5,939,941 A | * 8/1999 | Nair et al. | 330/251 |
| 5,990,747 A | * 11/1999 | Chaki et al. | 330/307 |

FOREIGN PATENT DOCUMENTS

JP          1205458     *  8/1989  ................ 330/307

OTHER PUBLICATIONS

Matsuno et al. "A 500–mW High–Efficiency SiMOS MMIC Amplifier for 900–MHz–Band Use" IEEE Transactions on Microwave Theory and Techniques vol. 48 Issue 8, Aug. 2000 pp. 1407–1410.*

* cited by examiner

Primary Examiner—Michael B Shingleton
(74) Attorney, Agent, or Firm—J. C. Patents

(57) ABSTRACT

The present invention provides an integrated inductor device having a high Q value, a low stray capacitance, and a small area that are compatible with conventional RF CMOS process. The inductor device has a plurality of conductive paths collocated in the same space for each gate, drain, and source of a RF transistor. The conductive paths are formed as a square-loop with 90 degrees turns with a space between adjacent conductive paths. Wherein the conductive paths are formed inside while staying geometrically parallel to each other. The adjacent conductive path carries a current in the same direction so all the conductive paths give positive contribution to a total magnetic flux.

16 Claims, 2 Drawing Sheets

INTEGRATED INDUCTOR FOR RF TRANSISTOR

BACKGROUND OF THE INVENTION

1. Field of the Invention

The present invention relates to an inductor utilized in low noise amplifiers using RF CMOS process; and, more particularly, to an integrated inductor device for a RF transistor in low noise amplifiers using RF CMOS process.

2. Description of Related Art

Wireless portable communication devices are rapidly growing as consumers rely more on wireless communications. Consumer electronics such as cellular phones, pagers, GPS, and other wireless devices operate in a radio frequency (RF). Integrated wireless portable communications devices would allow users to utilize one device for operating in a variety of communication systems. In addition, the integration of components offers attractive savings in terms of packaging size, cost, and energy requirement.

The advance of RF CMOS technology has made it possible to integrate onto a single chip a communication operating in a certain radio frequency range which can be used in various wireless portable communications devices. An important aspect of the devices is having a low noise amplifier (LNA). The prime objective of the LNA is to produce a signal with a low noise figure and minimum power consumption.

RF low noise amplifier (hereinafter, LNA) for integrated circuit (hereinafter, IC) process generally requires RF inductors for impedance matching purposes. The impedance of the entire IC should be matched for the highest performance. The LNA usually comprises at least a RF transistor and a plurality of matching on-chip inductors and RF chokes. The plurality of inductors is for matching the impedance of the input and output of the RF transistors to obtain lowest possible noise figure and higher self-resonance frequency for wider bandwidth. However fabrication and design of on-chip inductors require a substantial amount of chip area. Usually the fabrication of an inductor on a chip requires a reserved area of the chip and other RF components will not be allowed to be designed in the substrate over an on-chip inductor reserved area. Typically, a single on-chip inductor will consume an area of about 400 microns by 400 microns. Although the design of a single inductor may not pose a large problem to the available chip area, most modest RF IC generally require at least 3 or more inductors. It should thus be appreciated that on-chip inductors used in RF IC place a very large demand on chip area besides the inherent low Q level of the inductor, which necessarily translates into larger silicon chips and greater IC chip cost.

In order to match the impedance, a RF inductance of about 5 nH is usually required. A typical RF inductor by RF silicon process can deliver the best performance with inductance of 5 nH at a frequency of 2.4 GHz, Q value less than 10, and stray capacitance greater than 7.5 Ω. The performance of these on-chip inductors are still very poor and LNAs usually still require an external gate matching inductor, which has much higher performance due to integration difficulty.

The most challenging component to adapt to an IC is the inductor. Inductors are an essential component in a variety of RF devices, including LNA. Inductors must be able to provide a relatively large inductance values, ideally greater than 10 nH for high performance usage while being physically small such that a compact architecture can be achieved. A problem with conventional inductors is that high inductance values (L), as required in RF chokes, require a large silicon chip area. This large area requirement prevents miniaturization of chips. In addition, physically large RF chokes cannot operate at high frequencies, where the short wavelengths necessitate physically small and high performance components. RF chokes are crucial in LNAs because they prevent RF signals from coupling back to other critical electrical circuits.

The inductance value is mainly dependent on the geometry of the inductor and its physical dimension. In fact, the inclusion of passive components will often dictate the size of system more than any other part. Thus, design of high valued inductors within compact spaces is necessary for successful RF CMOS IC.

Various methods and technologies have been developed to integrate inductors into IC processes. Attempts to integrate inductors into silicon-based circuits have yielded either inductors of low quality factor (hereinafter, Q value) and high loss, as a result high noise figure and stray capacitance.

In silicon based RF CMOS process, RF inductors are generally achieved by thin metal wires and therefore suffer high stray capacitance and low self-resonance frequency due to the encasing of the transmission line conductors in the oxide insulators. The thickness of the thin metal wires are usually less than 1 um for logic process and approximately 2 um for the top metal layer of special RF process. A method of improving the performance of the inductor is to increase the width of the conductive paths. Because the conductive path is spiral-shaped, magnetic fields induced by current flow tend to force the current to flow along the inner or shorter edges of the spiral conductive path. Because of these "edge effects", increasing the width beyond a particular point ceases to show a concomitant improvement on the performance.

FIG. 1 shows a schematic diagram of a conventional LNA for RF CMOS process. The conventional LNA has at least a RF transistor 10, which its control terminal, input terminal, and output terminal are individually coupled to a separate inductor for impedance matching purposes. Matching inductor 11 is coupled to the gate of RF transistor 10 for matching the impedance of the RF input signal. A gate bias voltage supply is also connected to the gate of RF transistor 10 via a RF choke 15 for supply modulation and to ground via a bypass capacitor 17. Matching inductor 12 is coupled to the drain of RF transistor 10 for matching the impedance of the RF output signal. A drain bias voltage supply is also connected to the drain of RF transistor 10 via a RF choke 14 for supply modulation and to ground via a bypass capacitor 16. Matching inductor 13 is coupled to the source of the RF transistor 10 and ground.

The input, output, and control RF signals are individually coupled to separate inductors for impedance matching. At least 2 inductors are needed for one RF transistors and a LNA usually requires 2 to 4 inductors. Since on-chip inductors are usually low in Q value and require a substantial amount of area, the present invention provides an innovation integrated inductor device for use in IC systems which have superior quality factors, low noise figures, and substantially decreased size required for the inductors, all being obtained at a zero added fabrication.

SUMMARY OF THE INVENTION

It is to be understood that both the foregoing general description and the following detailed description are exemplary, and are intended to provide further explanation of the invention as claimed.

According to the above mentioned problems, one object of the present invention is to provide an integrated inductor device for a RF transistor, which has a high Q value, low stray capacitance, and a reduced area, which can be manufactured using conventional RF CMOS techniques at a lower cost. Furthermore the present invention relates to a problem of providing a RF CMOS IC integrated inductor device with higher performance for a wide range of frequencies.

The present invention provides a RF transistor with an integrated inductor device for the gate, drain, and source of the RF transistor. The integrated inductor device formed in the shape of a square-loop is collocated in the same defined area and space. Wherein the integrated inductor device is formed by a plurality of metal runners connected at preferably 90 degrees for forming three conductive paths in a square spiral shape while staying geometrically parallel to each other. The adjacent conductive paths carry a current in the same direction and each conductive path generates a magnetic field. The conductive paths are disposed such that the combined magnetic filed generated by the conductive paths in a space between the conductive paths is greater than the magnetic field generated by each of the conductive path in that space alone. All three conductive paths give positive contribution to a total magnetic flux. Lenz's law states (1):

$$L_{gate}\, di_{gate}/dt = N_{turn}\, d(\phi_{gate}+\phi_{drain}+\phi_{source})/dt$$

where, $L_{gate}$ is the inductance (L) value for the gate for example;

$i_{gate}$ is the current passed through the conductive path that is connected to for example the gate;

$N_{turn}$ is the total number of turns of the integrated inductor device;

$\phi_{gate}, \phi_{drain}, \phi_{source}$ are the magnetic flux of the gate, drain, and source respectively.

According to Lenz's law, inductance (L) is directly proportional to the number of turns of an inductor and the total magnetic flux. Therefore, the increased magnetic flux indicates a decrease in the number of turns of the integrated inductor device for a given level of inductance (L). Because fewer turns are used within a device formed in accordance with the present invention, the stray capacitance in the inductor device will be lower. Moreover because less metal runners are required for the inductor device, the series resistance of the inductor device is also reduced. Therefore advantageously, this design also has the surprising effect of providing a high inductance (L) value. The equation that renders the relationship between the quality factor (Q), inductance (L) value, and series resistance (R) is equation (2):

$$Q = \omega_0\, L/R$$

where, $\omega_0$ is the resonant angular frequency of oscillation;

L is the inductance of the coil; and

R is the series resistance taking into account the losses. By the equation, a much higher Q value is realized as a combined effect of a reduced series resistance (R) value and a higher inductance (L) value. As a result of the improvement of the integrated inductor device, the LNA also has a lower signal-to-noise (S/N) ratio and requires less overall chip area.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE INVENTION

As previously described, there are four major contribution to the low performance on-chip inductor: (1) high series resistance; (2) skin and other magnetic effects; (3) stray capacitance and the associated loss; and (4) large required area. Therefore one object of the present invention is to provide an integrated inductor device with high Q, low series resistance, and a small area by collocating the conductive paths (acting as inductor) of each terminal of a RF transistor in the same area.

Figure 2:
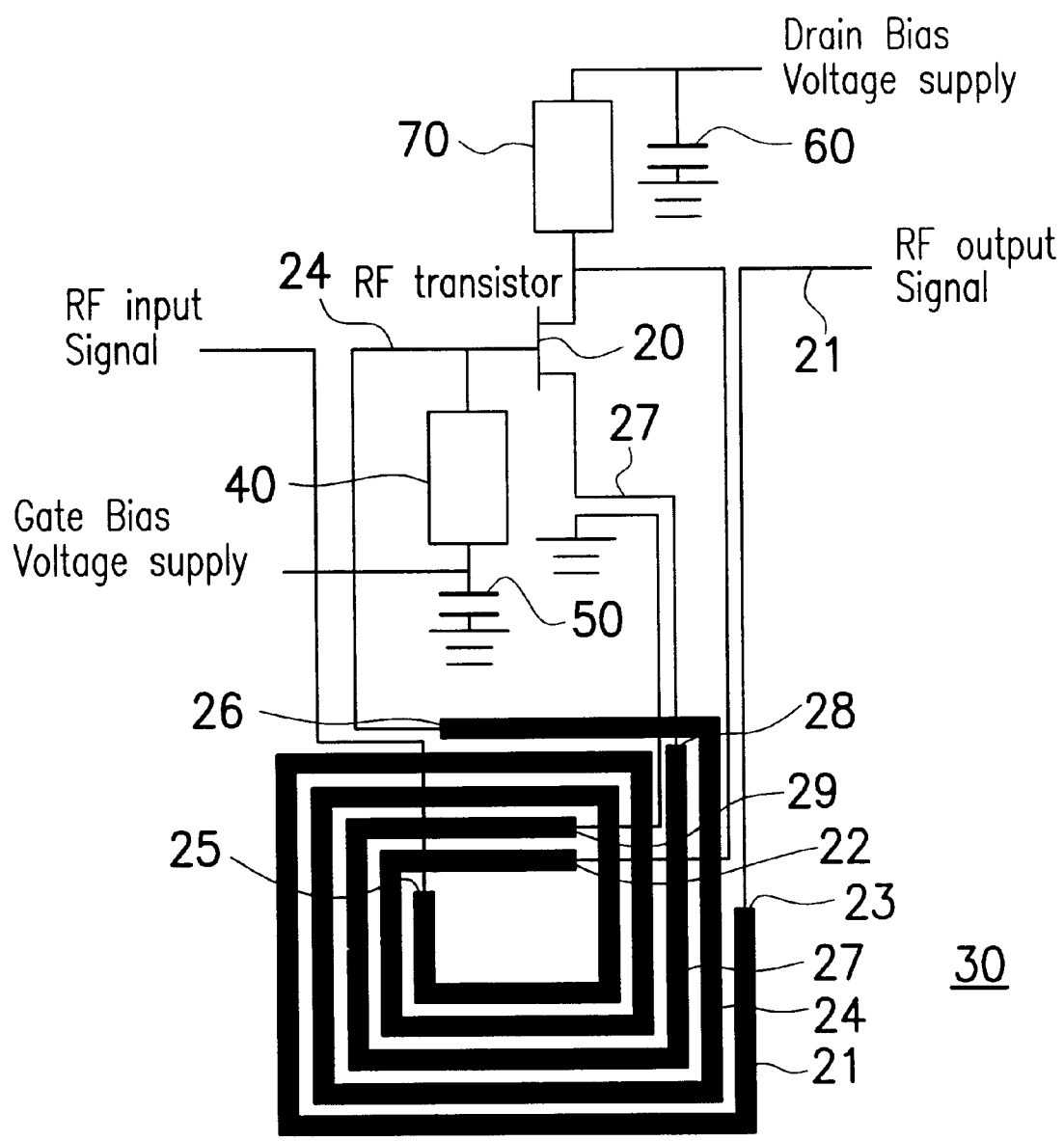
FIG. 2 is a schematic diagram of the integrated inductor according to an embodiment of the present invention.

FIG. 2 is a schematic diagram of an embodiment of the present invention. At least a RF transistor 20 such as MOSFET or BJT is provided in the LNA. In order to match the impedance of the signals in a LNA, a plurality of conductive paths 21, 24, and 27 formed by a plurality of metal runners connected at 90 degrees and shaped in square loop are provided in the area 30. Wherein, each spiral conductive path generates a magnetic field when a current is passed through. First conductive path 21 is coupled to the drain of RF transistor 20 for matching the impedance of the RF output signal. A drain bias voltage supply is coupled to the drain of RF transistor 20 via a RF choke 70 for supply modulation and to ground via bypass capacitor 60. Second conductive path 24 is coupled to the gate of RF transistor 20 for matching the impedance of the RF input signal. A gate bias voltage supply is coupled to the gate of RF transistor 20 via a RF choke 40 for supply modulation and to ground via a bypass capacitor 50. Third conductive path 27 is coupled to the source of RF transistor 20 and ground for matching impedance of the source of RF transistor 20.

In the embodiment shown in FIG. 2, first conductive path 21 forms a substantially square loop, having an input terminal 22 and output terminal 23. A first conductive bridge, formed under the conductive paths and separated by a layer of dielectric or magnetic material (not shown), is used to electrically connect input terminal 22 of first conductive path 21 to the drain of RF transistor 20. Second conductive path 24, also forms a square loop and disposed substantially inside and geometrically parallel to the first conductive path 21, has an input terminal 25 and output terminal 26. A second conductive bridge, formed under the conductive paths and separated by a layer of dielectric or magnetic material (not shown), is used to electrically connect input terminal 25 of second conductive path 24 to the gate of RF transistor 20. The second conductive bridge can be located in the same layer of the first conductive bridge or on a different layer. Third conductive path 27, also forms a square loop and disposed substantially inside and geometrically parallel to the first conductive path 21 and second conductive path 24. Third and fourth conductive bridge, formed under the conductive paths and separated by a layer of dielectric or magnetic material (not shown), are used to electrically connect input terminal 27 and output terminal 28 of third conductive path 27 to the drain of RF transistor 20 and ground respectively.

Each of the conductive path loop 21, 24, and 27 generates a magnetic field according to a current passed through the conductive paths. It is important that the direction of current flow of conductive path 21, 24, and 27 is identical so the magnetic flux of each conductive paths adds and does not cancel each other.

The horizontal spacing between the adjacent conductive paths on a substrate can be small because the magnetic filed decays according to the formula (1/d) with "d" being the center-to-center distance between the two adjacent conductive metal runners of the conductive paths.

Figure 1:
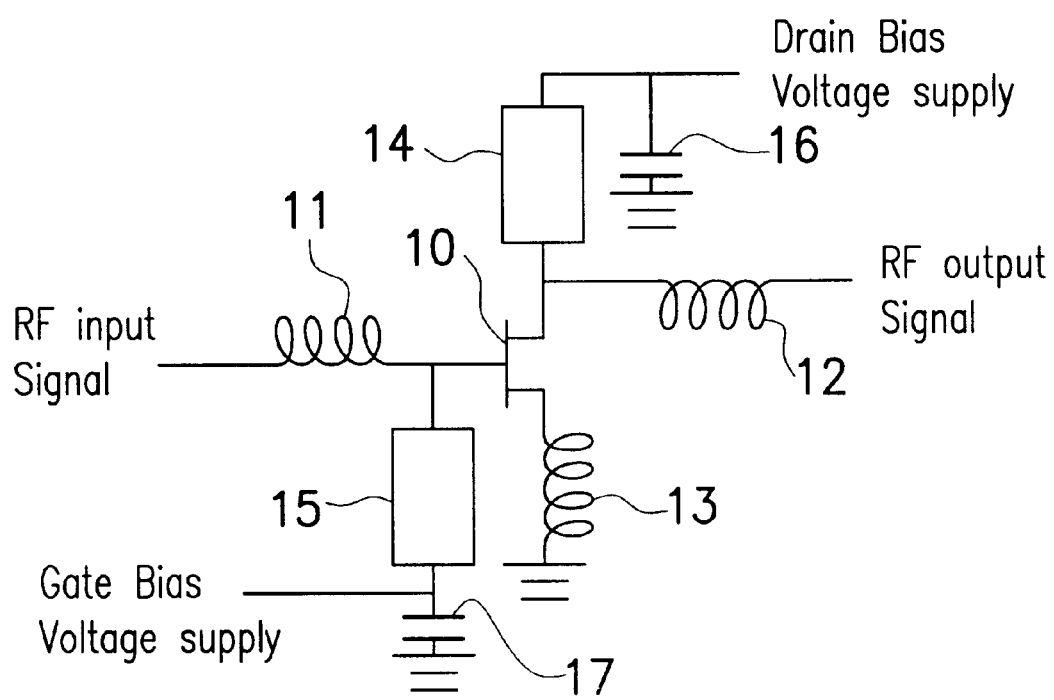
FIG. 1 is a schematic diagram of a conventional LNA for RF CMOS process.

From equation (1), it is realized that the inductance (L) value is obtainable by the equation. Since the magnetic flux $\phi$ of each conductive path (i.e. an individual inductor in FIG. 1 of prior art) is increased to $\phi_{gate}+\phi_{drain}+\phi_{source}$, the inductance (L) value for each terminal of RF transistor 20 can be increased from 2 to 4 times. From another point of view, $N_{turn}$ is greatly reduced if a same inductance (L) value is to be derived by the inductor device. Because of a reduced $N_{turn}$, the length of the metal runners of the conductive paths is greatly reduced and therefore physically reducing the size of each conductive path and the overall size of the integrated inductor device. For further reducing the size of the integrated inductor device, the conductive paths can all share the same inner core for inducing a magnetic field, which gives positive contribution to the total magnetic flux. Consequently, depending on the effect of the synergy in combining the magnetic fields, the size of the integrated inductor device can be downsized to the size of approximately one or two conventional inductor. Furthermore, because of the reduced $N_{turn}$, the stray capacitance of the inventive integrated inductor device is much lower. The integrated inductor of the present invention can effectively reduce the insertion loss during operation in a higher frequency band. Equation (2) renders the relationship between the quality factor (Q), inductance (L) value, and series resistance (R). The integrated inductor device provides a higher Q either with a higher inductance (L) value by maintaining the size of the integrated inductor device or with a lower series resistance (R) by reducing the size of the integrated inductor device (i.e. shortening the length of the conductive paths with a reduced $N_{turn}$). A higher Q value denotes lower noise figure, which is favorable and ideal for LNA. The noise added to the signal by the LNA results in a degradation of the signal-to-noise (S/N) at the output of the amplifier. Since the noise figure is lower in the present invention, the output of the LNA has less S/N degradation and a higher power transfer because the impedance of the input and output can be powerfully matched. Furthermore, less power consumption is required because of the higher efficiency, lower noise figure, and lower series resistance of the LNA.

The design of the RF CMOS IC is much more flexible because the physical dimension such as the thickness, length, width, $N_{turn}$, and spacing can be easily varied according to the optimization of noise figure, gain, and stability of the LNA.

The present invention will not incur additional cost or alteration in technology for the fabrication of the integrated inductor device in silicon substrate but will advantageously save cost because the integrated inductor device requires less chip area. The present invention can achieve the same inductance level requiring less area or achieving a much higher level of inductance and Q value with a given area.

Although the above embodiment explicitly describes three square loops formed on the same layer, it is to be understood that the present invention is not limited to the number of loops, the shape of the loops, the conductive material, and the layers of fabrication. The inductors can be formed on different layers overlapping or non-overlapping sandwiched in insulating material, overlapping signifies that the conductive paths in spiral loop formed in different layers substantially overlap each other when seen from top view.

In summary, there is a growing need to integrate more RF CMOS components into small, high performing, and cost effective arrangements, the integration of RF circuitry inductors with higher performance into the same area provides a very significant advantage over the prior art. The ability to integrate the inductors of a RF transistor into a defined area of space allows the inductors to be more high performance and to require less chip area. It allows a more flexible and higher integration design of RF IC for higher performance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A radio frequency (RF) circuit using silicon integrated circuit technology, comprising:
    at least a RF transistor; and
    an inductor device, comprising:
        a first conductive path coupled to a drain of the RF transistor with a first current provided for generating a magnetic field;
        a second conductive path coupled to a gate of the RF transistor with a second current provided for generating a magnetic field; and
        a third conductive path coupled to a source of the RF transistor with a third current provided for generating a magnetic field,
    wherein the first, second, third current flow in a same direction and the first, second, and third conductive paths are disposed in a way that a total combined magnetic field generated by the conductors is greater than the magnetic field generated by each of the conductive path itself.

2. The radio frequency (RF) circuit in claim 1, wherein the first conductive path, second conductive path, and third conductive path comprise a metal.

3. The radio frequency (RF) circuit in claim 1, wherein the first conductive path, second conductive path, and third conductive path form a square loop.

4. The radio frequency (RF) circuit in claim 1, wherein the second conductive path is formed inside and geometrically parallel to the first conductive path, and the second conductive path is formed inside and geometrically parallel to the first conductive path and second conductive path.

5. The radio frequency (RF) circuit in claim 3, wherein there is a space between the conductive paths.

6. The radio frequency (RF) circuit in claim 1, wherein the conductive paths are formed on a same layer.

7. The radio frequency (RF) circuit in claim 1 further comprising two RF chokes, a first RF choke is coupled to the gate of the RF transistor and a second RF choke is coupled to the drain of the RF transistor.

8. The radio frequency (RF) circuit in claim 1, wherein the circuit is used in a LNA for RF CMOS process.

9. A radio frequency (RF) circuit using silicon integrated circuit technology, comprising:
    at least a RF transistor; and an inductor device, comprising:
- a first conductive path coupled to a drain of the RF transistor with a first current provided for generating a magnetic field and located on a first layer;
- a second conductive path coupled to a gate of the RF transistor with a second current provided for generating a magnetic field and located on a second layer; and
- a third conductive path coupled to a source of the RF transistor with a third current provided for generating a magnetic field and located on a third layer, wherein the first, second, third current flow in a same direction and the first, second, and third conductive paths are disposed in a way that a total combined magnetic field generated by the conductors is greater than the magnetic field generated by each of the conductive path itself, and the first, second, and third layer are separated by dielectric layers.

10. The radio frequency (RF) circuit in claim 9, wherein the first conductive path, second conductive path, and third conductive path comprise a metal.

11. The radio frequency (RF) circuit in claim 1, wherein the first conductive path, second conductive path, and third conductive path form a square loop.

12. The radio frequency (RF) circuit in claim 9, wherein the second conductive path is formed inside and geometrically parallel to the first conductive path, and the second conductive path is formed inside and geometrically parallel to the first conductive path and second conductive path.

13. The radio frequency (RF) circuit in claim 12, wherein there is a spacing between the conductive paths.

14. The radio frequency (RF) circuit in claim 12, wherein the first, second, and third conductive paths are oriented to be overlapping each other.

15. The radio frequency (RF) circuit in claim 9 further comprising two RF chokes, a first RF choke is coupled to the gate of the RF transistor and a second RF choke is coupled to the drain of the RF transistor.

16. The radio frequency (RF) circuit in claim 9, wherein the circuit is used in a LNA for RF CMOS process.

* * * * *

UNITED STATES PATENT AND TRADEMARK OFFICE
CERTIFICATE OF CORRECTION

PATENT NO.    : 6,549,077 B1
DATED         : April 15, 2003
INVENTOR(S)   : Chewnpu Jou et al.

It is certified that error appears in the above-identified patent and that said Letters Patent is hereby corrected as shown below:

<u>Title page,</u>
Item [73], Assignee, please replace "United Microelectronics Corp., Hsinchu (TW)" to read -- United Radio Tek Inc., Hisnchu, Taiwan --

Signed and Sealed this

Twenty-sixth Day of August, 2003

JAMES E. ROGAN
*Director of the United States Patent and Trademark Office*